United States Patent [19]

Stengl et al.

[11] Patent Number: 4,672,738

[45] Date of Patent: Jun. 16, 1987

[54] METHOD FOR THE MANUFACTURE OF A PN JUNCTION WITH HIGH BREAKDOWN VOLTAGE

[75] Inventors: Reinhard Stengl, Munich; Ulrich Goesele, Hoehenkirchen; Christine Fellinger, Munich, all of Fed. Rep. of Germany

[73] Assignee: Siemens Aktiengesellschaft, Berlin and Munich, Fed. Rep. of Germany

[21] Appl. No.: 776,161

[22] Filed: Sep. 13, 1985

[30] Foreign Application Priority Data

Sep. 28, 1984 [DE] Fed. Rep. of Germany ....... 3435830

[51] Int. Cl.$^4$ .................... H01L 29/74; H01L 21/265
[52] U.S. Cl. .................................. 29/576 B; 148/1.5; 148/187; 148/DIG. 10; 357/13; 357/14; 357/20
[58] Field of Search ............... 29/576 B; 148/1.5, 187; 357/13, 14, 20

[56] References Cited

U.S. PATENT DOCUMENTS

| | | | |
|---|---|---|---|
| 4,099,998 | 7/1978 | Ferro et al. | 148/187 |
| 4,104,085 | 8/1978 | Zanfeld | 148/1.5 |
| 4,119,440 | 10/1978 | Hile | 148/1.5 |
| 4,125,415 | 11/1978 | Clark | 148/1.5 |
| 4,136,349 | 1/1979 | Tsang | 357/13 |
| 4,155,777 | 5/1979 | Dunkley et al. | 148/1.5 |
| 4,298,401 | 11/1981 | Nuez et al. | 148/1.5 |
| 4,374,389 | 2/1983 | Temple | 357/20 |
| 4,393,575 | 7/1983 | Dunkley et al. | 29/57 |
| 4,473,941 | 10/1984 | Turi et al. | 29/576 B |

FOREIGN PATENT DOCUMENTS 2213362  9/1973  Fed. Rep. of Germany ... 148/DIG. 10

OTHER PUBLICATIONS

Temple, IEEE-Trans. Electron Devices, Ed-30, (1983), 954.
Alcorn et al., IBM-TDB, 22, (1979), 1973.
Adler et al., IEEE-Trans. Electron Devices, ED-23, (1978), 956.
Bakowski et al., Solid St. Electronics, 18, (1975), 651.

*Primary Examiner*—Upendra Roy
*Attorney, Agent, or Firm*—Hill, Van Santen, Steadman & Simpson

[57] ABSTRACT

A method for the manufacture of a pn junction having a high breakdown voltage at the boundary surface of a semiconductor body, utilizing a mask which has a relatively large opening for introducing a dopant therethrough into the semiconductor body, the mask having a marginal edge which extends laterally beyond the edge of the relatively large opening. In the marginal edge, the mask is provided with smaller, auxiliary openings, the openings being sized and spaced such that lesser amounts of dopant pass through the opening as the distance of the auxiliary openings from the edge of the relatively larger opening increases. Upon introducing the dopant into the semiconductor body through the mask, there is generated a doping profile which gradually approaches the boundary surface with increasing distance from the edge of the relatively large opening.

10 Claims, 3 Drawing Figures

METHOD FOR THE MANUFACTURE OF A PN JUNCTION WITH HIGH BREAKDOWN VOLTAGE

BACKGROUND OF THE INVENTION

1. Field of the Invention

The present invention is in the field of manufacturing pn junctions and transistors so as to provide a high breakdown voltage at the boundary surface, and employs a specially designed mask to produce a controlled profile of dopant from the main body of dopant to the boundary layer.

2. Description of the Prior Art

There are known methods wherein at the same time that a pn junction is formed, one or more field-limiting ring structures surrounding the pn junction are diffused into the semiconductor body. These ring structures whose penetration depth corresponds to that of the pn junction are disconnected from external potentials during operation and act as voltage dividers, the divider ratio being defined by the mutual spacings and the spacing of the innermost ring structure from the pn junction. In this regard, reference is invited to the book entitled "Thyristor Physics" by A. Blicher, Springer Verlag, 1976, pages 231–234. The disadvantage of these ring structures is that they require a relatively high semiconductor area for achieving high breakdown voltages and are extremely sensitive to surface charges.

SUMMARY OF THE INVENTION

The present invention provides a method which guarantees the manufacture of an area-saving pn junction possessing a high breakdown voltage. In accordance with the present invention, we provide a mask having a relatively large opening for implanting or diffusing a dopant therethrough, the mask having a marginal edge extending laterally beyond the edge of the relatively large opening. The mask in the marginal edge has smaller, auxiliary openings, usually arranged in rows, the openings being sized and spaced such that lesser amounts of dopant pass through the openings as the distance of the auxiliary openings from the edge of the relatively large opening increases. Thus, upon passing a dopant through the mask into the semiconductor, there is generated a doping profile gradually approaching the boundary surface as the distance from the edge of the relatively large opening increases.

The method of the present invention enables the manufacture of pn junctions which despite a relatively small area, have a breakdown voltage which corresponds to the breakdown voltage for the part of the pn junction which proceeds parallel to the boundary surface of the semiconductor body, i.e., it corresponds to the volume breakdown voltage.

In the preferred embodiment of the invention, the auxiliary openings are located in discrete rows, and are in the form of spaced apertures.

In another form of the invention, the marginal portion of the mask may include a plurality of sets of auxiliary openings which are laterally spaced beyond the first set but are preferably identical in configuration to the first set. Then, when introducing dopant into the semiconductor, it is possible to selectively introduce through the various sets of auxiliary openings by covering selected sets of the auxiliary openings to prevent passage of dopant therethrough.

BRIEF DESCRIPTION OF THE DRAWINGS

The present invention will be explained in greater detail with reference to the drawing in which.

DESCRIPTION OF THE PREFERRED EMBODIMENTS

Figure 1:
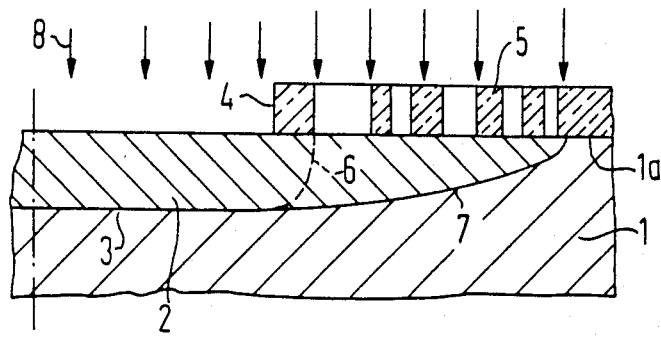
FIG. 1 is a cross-sectional view through the edge zone of a pn junction manufactured in accordance with a method of the present invention.

FIG. 1 illustrates a semiconductor body 1 composed, for example, of n-doped silicon having a doping concentration of $10^{14}$ cm$^{-3}$, in which a p-conductive semiconductor region 2 is formed. When the pn junction between the semiconductor body 1 and the doped region 2 is charged with a voltage making the semiconductor body 1 at a more positive potential than the semiconductor doped region 2, to a sufficient extent to reach the so-called volume breakdown voltage, a breakdown current flows within that portion of the pn junction identified at reference numeral 3 in which the boundary surface between the semiconductor body 1 and the doped region 2 proceeds roughly parallel to the boundary surface 1a of body 1. Usually, the pn junction is generated according to a method where a dopant, for example, boron, is introduced through the opening 4 of a doping mask 5 of uniform thickness, being introduced by way of diffusion into the semiconductor body 1. A lateral limitation 6 is thereby produced which comprises such a small radius of curvature that a breakdown may occur at this location with a voltage which lies significantly below the volume breakdown voltage.

The present invention eliminates the problem of producing the pn junction by providing a lateral extension 7 so that the doping profile in this region gradually approaches the boundary surface 1a so gradually that a very high breakdown voltage comparable to the volume breakdown voltage is also achieved for the extension labeled 7.

In accordance with a first method of the invention, dopant ions are introduced into the semiconductor body 1 in a first step by means of an ion implantation which is indicated by the arrows 8. The doping mask 5 has an opening 4 employed for the formation of the pn junction between semiconductor body 1 and the doped region 2, the opening 4 being relatively large. Smaller, auxiliary openings 9 through 13 are located in a region 51 forming part of the marginal edge of the mask beyond the main opening 4. These openings, 9 through 13, are dimensioned so as to permit less and less implantation of the dopant therethrough as the distance from the edge of the opening 4 increases. A part of the mask 5 is shown shaded in the plan view of FIG. 2 for purposes of clarity. It can be seen that the openings 9 and 10 are continuous channels, the channel 10 having a lesser width than channel 9 whereas the openings 11 through 13 are apertures and, in particular, provide square surfaces which have smaller side lengths at increasing distances from the edge of the opening 4. The areas of all openings 11 lying at a uniform distance from the edge of the opening 4 define a total area which is smaller than the area of the channel-shaped opening 10. Furthermore, the areas of all openings 12 having a constant spacing from the edge of the opening 4 form a total area which is in turn smaller than the total area of the openings 11, and so on.

In the second method step, consisting of thermal diffusion, the dopant atoms applied through the openings 4 and 9 through 13 are diffused further into the semiconductor body 1 at temperatures which generally range from 500° to 1200° C., and at exposure times up to 40 hours. The quantities of dopant which have penetrated through the openings 9 through 13 thereby act as discrete diffusion sources which are defined by the position of these openings. The dopant atoms diffused in from these sources form a doping profile 7 which very gradually approaches the boundary surface 1a with increasing distance from the edge of the opening 4 in comparison with the dopant atoms implanted through the main opening 4 which yield a dopant profile 3 which is essentially parallel to the boundary layer 1a. The boundary 3, 7 of the pn junction thereby occurs at a penetration depth in which the concentration of the implanted dopant has decreased to the value of the basic doping of the semiconductor body 1.

Proceeding from the semiconductor region below the opening 4, it will be seen that there is an average lower and varying implantation dose occurring for the region below the edge zone of the mask 5 containing the openings 9 through 13.

In other forms of the invention, the auxiliary openings 11 through 13 can comprise rectangular, circular, or other shapes which can be reasonably manufactured. The openings 9 and 10 can likewise be replaced by further rows of openings which are composed of holes. On the other hand, the openings 11 through 13 can be replaced by openings which are continuous channels dimensioned narrower and narrower with increasing distance from the edge of the opening 4. The implantation dose can also be varied by dimensioning the individual rows of openings or channels correspondingly in terms of their mutual spacings or also by varying the spacings of the openings 11 through 13 within the individual rows.

A further embodiment of the present invention provides a mask 5 which is designed with not only one marginal edge zone 51 but with two edge zones 51 and 52 adjacent to each other. These two marginal edge zones are preferably identically configured. The openings in the edge zone 52 which correspond to the openings 9 through 13 in terms of size and position are identified at reference numerals 9' through 13'. When the implantation dose which is supplied to the semiconductor body 1 through the openings of the edge zone 52 is smaller than the implantation dose which is introduced through the openings of the edge zone 51, then the same effect is achieved as though the further openings 9' through 13' were further reduced in size in comparison to the openings 13. In order to achieve a lower implantation dose for the edge zone 52, the initial method step is subdivided into two steps of which the first is composed of an implantation which is executed at a relatively low implantation dose of, for example, $2 \times 10^{12}$ cm$^{-2}$ and refers to both edge zones 51 and 52 in addition to the opening 4. The second step is composed of an implantation which is carried out with a higher implantation dose of, for example, $1.4 \times 10^{14}$ cm$^{-2}$. This dose, however, only is applied to the opening 4 and the edge zone 51, this being achieved by covering the edge zone 52 by means of an additional doping mask.

A second method of the invention for manufacturing the pn junction involves introducing the dopant by diffusion into the semiconductor body 1 through the use of a doping mask 5 which corresponds to that described above but which is adjacent to the boundary surface 1a. This diffusion is subdivided into two diffusion steps, in the first of which, there is employed a mask having two edge zones 51 and 52 while a mask having only one edge zone 51 is employed in the second step. The mask 5 in the first step is employed in the form shown in FIG. 2, comprising two edge zones 51 and 52 but in the second step is covered in the region of the edge zone 52 by an additional doping mask. Despite openings 9 and 9', 10 and 10', and so on, in the edge zones 51 and 52 of the same size, the same effect is achieved in this form which would be achieved otherwise with a further reduction of the openings 9' through 13' in comparison to the openings 13.

Within the scope of the present invention, the doping mask 5 can also be fashioned with a plurality of edge zones 51, 52 adjacent each other, these being respectively identically structured whereby a corresponding number of steps of the first or second described method of the invention are then performed with a different number of covered edge zones. In other words, the various zones can be selectively covered during implantation or diffusion. The same effect can thus be achieved as though each of the edge zones included openings which were further reduced in size in comparison to the smallest openings of the neighboring edge lying closer to the edge of the opening 4.

Figure 2:
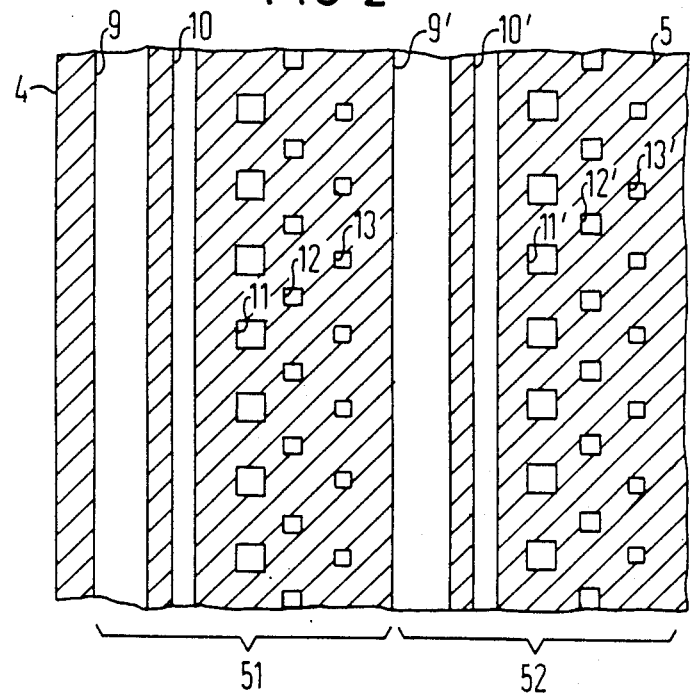
FIG. 2 is a plan view of the doping mask employed in the method of the invention.

FIGS. 1 and 2 show only one part of the structure of the pn junction 1, 2 and one part of the doping mask 5. The overall structure can, however, be taken as being dynamically balanced, with the dot-dash line A in FIG. 1 viewed as the axis of symmetry.

A doping mask 5 within the framework of the invention can, for example, be composed of a photoresist material or silicon dioxide. The implantation steps and diffusion steps or the various substeps to be applied in the implantation of the method are known per se and, for example, are disclosed in the book by Rein and Ranfft entitled "Integrierte Bipolarschaltungen" in the series "Halbleiter-Elektronik", Springer-Verlag, Berlin 1980, pages 37 through 44.

Figure 3:
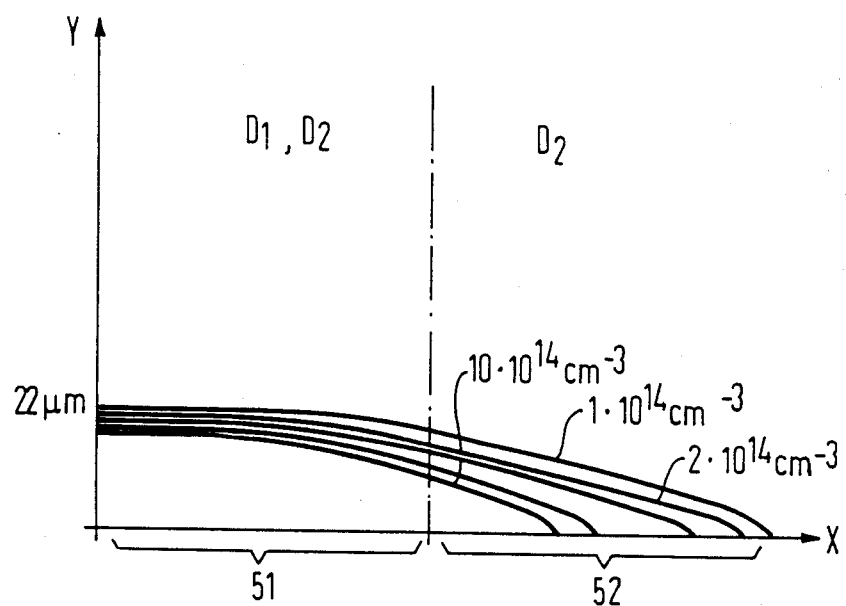
FIG. 3 is a graph showing the isoconcentration lines of a pn junction manufactured in accordance with the present invention.

FIG. 3 illustrates a diagram of the isoconcentration (uniform concentration) lines which are present in a pn junction manufactured in accordance with the invention and composed of a silicon semiconductor body and a semiconductor region 2 doped with boron having a maximum penetration depth of 22 microns. The lateral distance on the x axis extends from the edge of the opening 4 of the doping mask 5 and the penetration depth is illustrated on the y axis. This curve is based upon the first manufacturing method of the invention, whereby a first substep having an implantation dose of $2 \times 10^{12}$ cm$^{-2}$ has been applied to the region of the opening 4 and the edge zones 51 and 52, being followed with a second substep having a dosage of $1.4 \times 10^{14}$ cm$^{-2}$ with which a doping of the semiconductor body 1 in the region of the opening 4 and the edge zone 51 was carried out. The uppermost isoconcentration line corresponds to a doping concentration of $10^{14}$ cm$^{-3}$, i.e., corresponds to the basic doping of the semiconductor body. The lowest illustrated line corresponds to a doping concentration of $10 \times 10^{14}$ cm$^{-3}$.

It will be understood that various modifications can be made to the described embodiments without departing from the scope of the present invention.

We claim as our invention:

1. A method for the manufacture of a pn junction having a high breakdown voltage at the boundary surface of a doped semiconductor body which comprises:

providing a mask having a relatively large opening for passing a dopant therethrough, said mask having a marginal edge extending laterally beyond the edge of said relatively large opening, said mask having smaller, auxiliary openings in said marginal edge, said openings being sized and spaced such that lesser amounts of dopant pass through said openings as the distance of said auxiliary openings from the edge of said relatively larger opening increases, and ion implanting a dopant through said mask into said semiconductor to thereby form discrete diffusion sources defined by said auxiliary openings to generate a doping profile which gradually approaches the boundary surface as the distance from the edge of the relatively large opening increases.

2. A method according to claim 1 wherein said auxiliary openings are located in discrete rows.

3. A method according to claim 1 in which said auxiliary openings are in the form of spaced apertures.

4. A method according to claim 1 wherein said auxiliary openings are spaced apertures arranged in discrete rows spaced from the edge of said relatively large opening.

5. A method according to claim 1 wherein said mask has a first set of auxiliary openings adjacent said relatively large openings, and a second set of auxiliary openings laterally spaced beyond said first set, both sets having openings therein whose size and spacing are such that lesser amounts of dopant pass through said openings as the distance from the edge of said relatively large opening increases, implanting or diffusing dopant into said semiconductor through said relatively large opening and both sets of auxiliary openings in a first step, and putting a dopant in a second step at a higher dosage level through said relatively large opening and through said first set of auxiliary openings while closing off the openings in said second set of openings.

6. A method for the manufacture of a pn junction having a high breakdown voltage at the boundary surface of a doped semiconductor body which comprises:

providing a mask having a relatively large opening for passing a dopant therethrough, said mask having a marginal edge extending laterally beyond the edge of said relatively large opening, said mask having a plurality of sets of smaller, auxiliary openings in spaced relation along said marginal edge, the openings in each set being sized and spaced such that lesser amounts of dopant pass through said openings as the distance of the openings in each set from the edge of said relatively large opening increases, and passing dopant through said relatively large opening and through selected ones of said sets of auxiliary openings while covering the remaining sets of auxiliary openings to prevent passage of dopant therethrough.

7. A method according to claim 6 wherein said sets of auxiliary openings are substantially identical in configuration.

8. A method according to claim 6 in which said passing dopant through said openings is carried out by ion implantation followed by thermal diffusion.

9. A method according to claim 6 in which said passing dopant through said openings is carried out by diffusion.

10. A method for the manufacture of a pn junction having a breakdown voltage at the boundary surface of a doped semiconductor body which comprises:

providing a mask having a relatively large opening for passing a dopant therethrough, said mask having a marginal edge extending laterally beyond the edge of said relatively large opening, said mask having smaller, auxiliary openings in said marginal edge, said openings being sized and spaced such that lesser amounts of dopant pass through said openings as the distance of said auxiliary openings from the edge of said relatively larger opening increases, and diffusing a dopant through the mask and into said semiconductor to thereby form discrete diffusion sources defined by said auxiliary openings to generate a doping profile which gradually approaches the boundary surface as the distance from the edge of the relatively larger opening increases.

* * * * *